United States Patent [19]

Dufour

[11] Patent Number: 5,717,347

[45] Date of Patent: Feb. 10, 1998

[54] LOGIC CIRCUIT OF THE EMITTER-COUPLED TYPE, OPERATING AT A LOW SUPPLY VOLTAGE

[75] Inventor: Yves Dufour, Sunnyvale, Calif.

[73] Assignee: U.S. Philips Corporation, New York, N.Y.

[21] Appl. No.: 631,385

[22] Filed: Apr. 12, 1996

[30] Foreign Application Priority Data

Apr. 12, 1995 [FR] France ............... 95 04400

[51] Int. Cl.$^6$ ............. H03K 19/086; H03K 19/20
[52] U.S. Cl. ............. 326/127; 326/126; 326/80
[58] Field of Search ............. 326/127, 126, 326/80, 77

[56] References Cited

U.S. PATENT DOCUMENTS 3,094,632  6/1963  Wartella .................. 326/127
5,148,059  9/1992  Chen et al. .............. 326/126
5,256,917  10/1993  Flannagan et al. ........ 326/126
5,329,182  7/1994  Yu ......................... 326/126

FOREIGN PATENT DOCUMENTS 5564438  5/1980  Japan.

*Primary Examiner*—Edward P. Westin
*Assistant Examiner*—Richard Roseen

[57] ABSTRACT

The invention relates to a logic circuit of the emitter-coupled type. For operation with a low supply Voltage, for example a single battery element, the bases of the transistors (Q1, Q2) forming a differential pair receive the input signal (Vi, $\overline{Vi}$) via a coupling capacitance (C1, C2), a low-frequency bias being provided by means of MOS transistors (M1, M2) driven by input signals opposed to those applied to the corresponding bases, said MOS transistors being coupled to a line (3) at a voltage (vb) higher than the supply voltage (V1) supplied by a generator (10) provided for this function.

5 Claims, 3 Drawing Sheets

LOGIC CIRCUIT OF THE EMITTER-COUPLED TYPE, OPERATING AT A LOW SUPPLY VOLTAGE

BACKGROUND OF THE INVENTION

The invention relates to a logic circuit with bipolar transistors, of the emitter-coupled current-switching type, which circuit comprises at least one differential pair of transistors of given polarity forming a switching stage, whose collector-emitter paths are operated respectively between a first and a second supply terminal, which pair is formed by a first and a second transistor whose emitters are connected to one another and are coupled to the second supply terminal via a current source and in which at least one base receives an input signal via a coupling capacitance and is also coupled to a base supply voltage source via an element having a high resistance.

Emitter-coupled logic circuits are well known and are widely used because of their ability to operate at high switching frequencies. In a technique know as ECL the output signals of a switching stage are normally applied to the input of another switching stage after having passed through a buffer stage comprising an emitter-follower transistor which, by lowering the d.c. level of the signal, strongly reduces the impedance at which the output signal is available.

In a variant of the emitter-coupled logic, known as CML, the output signals of a switching stage, which appear on the collectors of the transistors of a differential pair, can be applied directly to the input of another switching stage, i.e. to the bases of the transistors of another differential pair. In this case the logic signals appearing in the circuit have a "high" value equal to the supply voltage to which the collectors of the transistors are coupled and a "low" voltage whose deviation from the "high" value is limited to 100 or 200 mV, so as to ensure that the transistors have a collector-emitter voltage which is adequate to avoid their saturation.

From the document JP-A-55 64438 it is known to apply an input signal to a base of a transistor of the differential pair via a coupling capacitance, said base being d.c. biassed by means of a voltage source via a resistor having a high resistance value. This arrangement serves particularly to balance the operation of the differential pair whose other transistor has its base coupled to ground by a capacitance.

In the case of portable apparatuses, for example in radiocommunication, the primary object is always to reduce their dimensions and weight. Since these apparatuses are battery-powered it is attempted to reduce the consumption of the circuits in order to prolong the life of the batteries. However, the batteries themselves account for a substantial part of the volume and weight of some apparatuses, so that it becomes desirable to reduce the number of battery elements to be used: for example 2 elements instead of 3 or even 1 element instead of 2, if possible.

This being so, there is reason to conceive new circuit arrangements which can take the place of the conventional arrangements, which will no longer be useable when powered with supply voltages below 1.3 V.

It is an object of the present invention to provide a solution so as to realize emitter-coupled logic circuits which can operate at a low supply voltage.

SUMMARY OF THE INVENTION

Thus, a logic circuit in accordance with the present invention is characterized in that, coming from a voltage supplied by an output of a supply voltage step-up circuit, the base supply voltage source supplies a controlled voltage which, relative to the second supply terminal, is higher than the voltage at the first supply terminal, and in that said high-resistance element is an insulated-gate field-effect transistor whose channel is of a conductivity type inverse to said given conductivity type and whose gate receives the logic inverse of the input signal.

The circuit in accordance with the invention uses the supply voltage furnished by, for example, one battery to drive the collector-emitter path of the transistors of the switching stage. A voltage of the order of 1 V or even slightly less is then sufficient.

As a result of the comparatively large voltage drop across the base-emitter junction of the transistors, particularly at low temperatures, the bases of the transistors are no longer at a direct voltage which is adequate to obtain a bias such that saturation of the transistors is avoided. Therefore, the invention envisages the use of a voltage step-up circuit to realize a voltage source by means of which the bases of the transistors can be biassed to a voltage higher than the actual supply voltage. Thus, the circuit continues to operate normally as long as the supply voltage remains adequate to drive the collectors of the transistors. The use of a voltage step-up circuit in accordance with the invention is simplified by the fact that the current required to drive the bases of the transistors is only very small in comparison with the current supplied by the collector-emitter path of a transistor in a conductive state.

Biassing the bases of the transistors via a resistor of large value would require a large interstage coupling capacitance, without which the switching stage could not handle a low-frequency signal. This solution has the drawback that this capacitance occupies space on the surface of the integrated circuit.

In contrast, owing to the use of field-effect transistors for the base bias, the invention allows signals of very low frequency to be handled, even if the coupling capacitance is very small, for example 1 or 2 pF, and thus easy to integrate.

In a preferred embodiment of the invention the logic circuit is further characterized in that the base supply voltage source comprises:

another bipolar transistor referred to as third transistor, another field-effect transistor referred to as fourth transistor, which third and which fourth transistor are of constructions similar to those of the transistors of a switching stage, the drain of the fourth transistor being connected to the base of the third transistor, and another current source disposed between the output of the voltage step-up circuit and the source of the fourth transistor, to which current source the collector of the third transistor is connected in a node forming an output of said base supply voltage source, the gate of the fourth transistor being supplied with a voltage within the variation interval of the input signal and a direct voltage being impressed on the emitter of the third transistor.

Thus, the base supply voltage source supplies a voltage whose characteristics are very suitable for use in the switching stage.

In an advantageous embodiment of the invention the voltage applied to the gate of the fourth transistor is substantially equal to the median value of the input signal, and the value of the current supplied by the other current source is equal to half the current fed to the coupled emitters of the switching stage.

The base supply voltage source is then controlled in such a manner that, if the differential transistor pair is operated at its switching threshold, the voltage at the commoned emitters is equal to the voltage impressed on the emitter of the third transistor by the base supply voltage source.

As will be explained in more detail hereinafter, the resulting control remains effective when the temperature varies because the transistors, regardless of whether they are used in the switching stage or in the base supply voltage source, can be constructed to have very similar electrical characteristics.

To maintain a substantially constant collector-emitter voltage of the transistors of the switching stage when the supply voltage of the circuit varies it is advantageous in accordance with the invention that in the base supply voltage source the direct voltage impressed on the emitter of the third transistor is supplied by voltage-shifting means which are also connected to the first supply terminal.

Of course, the invention is not limited to the case that a single differential transistor pair is coupled to a base supply voltage source but, on the contrary, also envisages the use of a plurality of differential pairs in conjunction with a single base supply voltage source.

Moreover, the invention also applies to the case in which two differential transistor pairs are arranged in series between the first and the second supply terminal.

particularly, in a variant of the invention, the logic circuit is characterized in that in the switching stage the coupled emitters of the differential pair of transistors are driven by the current source via the collector-emitter path of one transistor of another differential pair of transistors whose bases are driven by direct coupling of an output signal of another stage.

The following description with reference to the accompanying drawings, given as non-limitative examples, will make the principle of the invention and how it can be realized more fully understood.

DETAILED DESCRIPTION OF THE PREFERRED EMBODIMENTS

Figure 1:
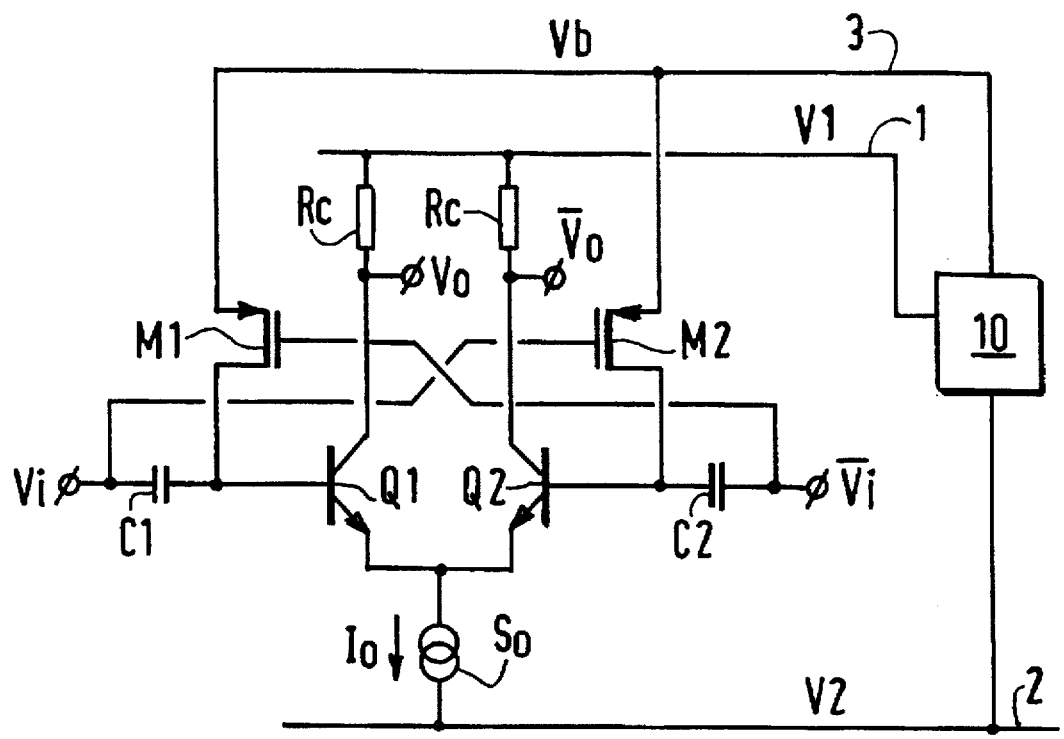
FIG. 1 is the circuit diagram of a logic circuit in accordance with the invention.

In FIG. 1 the circuit in accordance with the invention comprises a differential pair of NPN transistors Q1, Q2 which form a switching stage and whose collector-emitter paths are arranged between a first supply terminal 1 at a positive voltage V1 and a second supply terminal 2 at a voltage V2, being in the present example a reference voltage. The transistors Q1 and Q2 have their emitters interconnected. They are coupled to the supply terminal 2 via a current source So which supplies a current Io. The collectors of the transistors are coupled to the supply terminal 1 via two load resistors Rc of equal value. The base of the transistor Q1 receives an input signal Vi via a coupling capacitance C1 and the base of the transistor Q2 receives the logic inverse of the input signal Vi via a coupling capacitance C2. The collector of the transistor Q2 supplies an output signal Vo and the collector of the transistor Q1 supplies the logic inverse of the signal Vo, which is also the logic inverse of the input signal Vi.

With respect to low frequencies and direct current conditions, the transistors are biassed from a base supply voltage source 10, which supplies at its output a voltage Vb higher than the voltage V1 at the supply terminal 1. This source 10 includes a voltage step-up circuit which derives from the supply voltage V1 a higher voltage Vb available on a line 3. The base of the transistor Q1 is coupled to the line 3, which carries the base supply voltage Vb, via a MOS field-effect transistor M1 whose gate receives the logic inverse of the input signal Vi. In a symmetrical manner, the base of the transistor Q2 is coupled to the line 3 via a transistor M2 which is of the same type as the transistor M1 and whose gate receives the logic input signal Vi. As will be explained in greater detail hereinafter, the base supply voltage source 10 is constructed in such a manner that the input signal Vi and its logic inverse $\overline{Vi}$, which are applied to the gates of the transistors M2 and M1, are signals such as those received from the output of another switching stage similar to that shown in the Figure. In other words, the output signals Vo, $\overline{Vo}$ have the same voltage levels as the input signals Vi and $\overline{Vi}$.

Thus, the present switching stage can switch signals of a very high frequency because the input signals are applied via coupling capacitances C1, C2. Yet, the stage is also capable of preserving a suitable output waveform when the frequency of the input signals is low, because a d.c. bias is applied by the field-effect transistors M1 and M2.

The circuit diagram shown in FIG. 1 is that of an amplifier or inverter, depending on how the output signals Vo and $\overline{Vo}$ are used.

Figure 2:
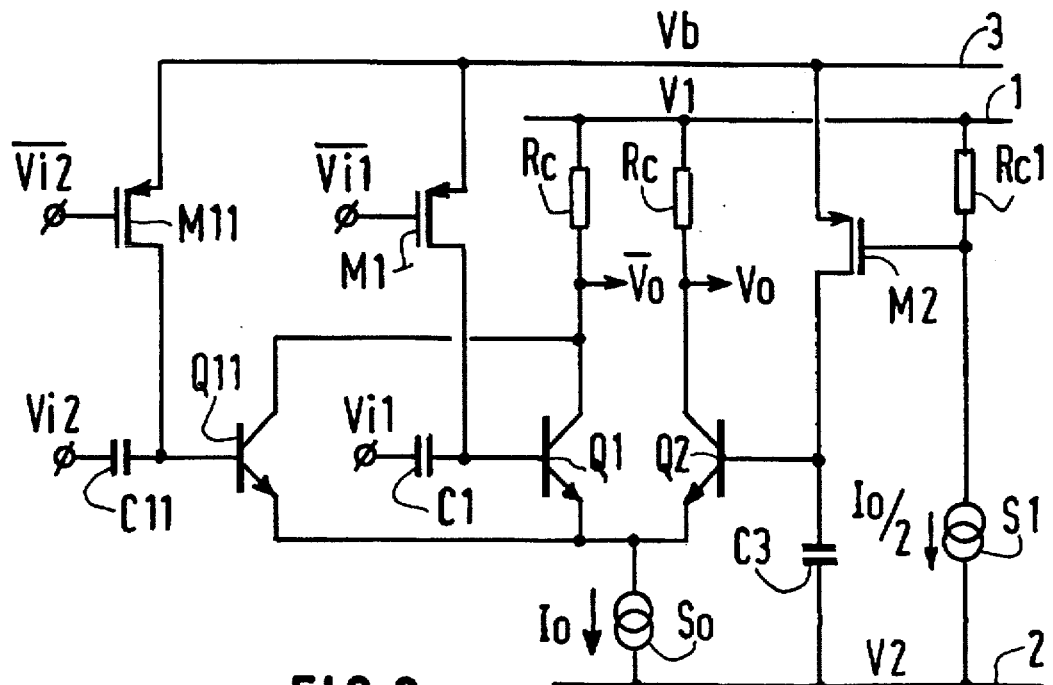
FIG. 2 is a circuit diagram of an OR (or NOR) gate using a circuit in accordance with the invention.

FIG. 2 shows the circuit diagram of an OR gate or NOR gate, depending on the use of the output signals. Elements having the same functions as in FIG. 1 bear the same reference symbols. The circuit shown in FIG. 2 comprises a differential pair of NPN transistors Q1, Q2 whose commoned emitters receive a current Io supplied by a current source So.

In comparison with that shown in FIG. 1 this circuit shows a transistor Q2 which, via the transistor M2, receives a fixed bias equivalent to the median of the logic input signal. This bias is obtained by means of a resistor Rc1 having one end connected to the supply terminal 1 and the other end to a current source S1, which supplies a current Io/2 to the second supply terminal 2.

Therefore, with respect to the supply terminal 1 the voltage drop across the resistor Rc1 is equal to half the voltage swing of the output signal. The field-effect transistor M2, which is connected between the line 3 carrying the base supply voltage Vb and the base of the transistor Q2, has its gate connected to the node between the resistor Rc1 and the current source S1.

An input signal Vi1 is applied to the base of the transistor Q1 in a manner similar to the input signal Vi in the arrangement shown in FIG. 1. Likewise, a field-effect Transistor M1 controls the base bias of the transistor Q1 under the influence of the inverse logic of the signal Vi1. To obtain a two-input OR function an additional NPN transistor Q11 has its collector-emitter path connected parallel to that of the transistor Q1 and its base, which receives another input signal Vi2. The collector of the transistor Q11 is coupled to the collector of the transistor Q1, where it shares the same load resistor supplying an output signal $\overline{Vo}$. The base of the transistor Q11 receives another input signal Vi2 via a coupling capacitance CELL. It is bias seal by means of a field-effect transistor M11 whose source is connected to the line 3 carrying the base supply voltage Vb and whose gate receives the logic inverse of this other input signal Vi2. When the two input signals Vi1 and Vi2 are low, the current of the source So flows mainly through the transistor Q2 and, when at least one of the inputs which receive the signal Vi1 or Vi2 is high, the current of the source So flows mainly in the load resistor common to the transistors Q1 and Q11.

The circuit shown in FIG. 2 thus performs an OR or NOR function depending on the manner in which the output signals Vo and $\overline{Vo}$ are used after this stage. As is known, most logic functions can be realized by means of a combination of NOR gates, so that the circuit diagram shown in FIG. 2 is a typical example of a logic circuit using the techniques in accordance with the invention.

Figure 3:
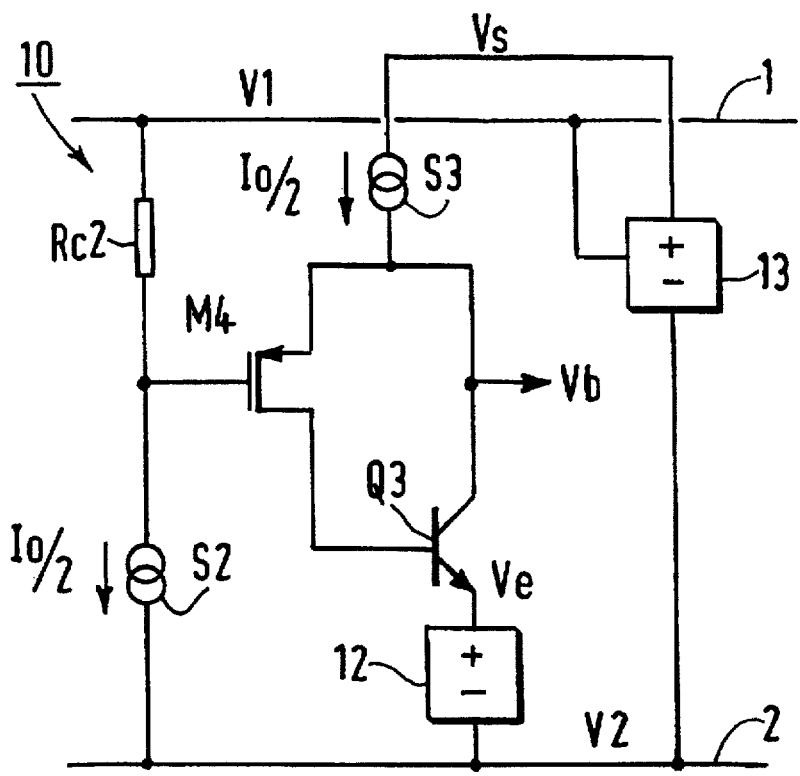
FIG. 3 is a basic circuit diagram of a base supply voltage source and FIG. 4 is a diagram of an example of such a voltage source, and FIG. 5 gives the circuit diagram of another embodiment of the invention.

FIG. 3 is the circuit diagram of a voltage source as represented by the reference numeral 10 in FIG. 1.

The base supply voltage source in FIG. 3 supplies an output voltage Vb which, as appears from the foregoing, is higher than the voltage V1 at the supply terminal 1. This supply voltage source consequently comprises a voltage multiplier circuit 13 which, starting from the power at the supply terminal 1, supplies an output voltage Vs larger than V1. By means of a voltage doubler which is well-known in the art and which requires no description here, a voltage Vs is obtained which is slightly smaller than twice the voltage V1, taking into account the efficiency typical of this type of circuit. Normally, such a voltage is adequate for the purpose of the invention.

The voltage source 10 comprises an NPN transistor Q3 and a P-channel MOS field-effect transistor M4. The drain of the transistor M4 is connected to the base of the transistor Q3 and the emitter of the last-mentioned transistor is fixed at a voltage Ve obtained by means of a voltage generator 12. This voltage may be fixed at a few tenths of volts above the voltage V2 at the second supply terminal 2, for example by means of a Schottky diode. A voltage corresponding to the median of the input signal is applied to the gate of the transistor M4, which voltage is formed by a voltage drop across a resistor Rc2 connected to the supply voltage V1, through which resistor a current Io/2 supplied by a current source S2 flows. The value of this current corresponds to half the nominal current supplied to the transistor pairs in a switching stage. The gate of the transistor M4 is thus brought at a voltage corresponding to that at an output of a switching stage operated at the switching threshold. The source of the transistor M4 is supplied with the voltage Vs via a current source S3, which supplies a current Io/2. Finally, the collector of the transistor Q3 is connected to the source of the transistor M4 and to the current source S3 in a node forming the output of the base supply voltage source, supplying the voltage Vb.

The operation of the circuit shown in FIG. 3 will now be explained briefly. First of all, it is to be noted that the voltage Vb, which furnishes the base current of the switching stages, need only supply a small current, which may be ignored. When the base current of the transistor Q3 is also ignored, it may be assumed that this transistor is operated under conditions comparable to operation at the switching threshold of one of the transistors of a switching stage. As a matter of fact, the gate of the transistor M4 receives a voltage corresponding to the median of the input signal and its source is at a voltage Vb, so as to achieve that the transistor Q3 is operated under the desired conditions to supply a current Io/2. The arrangement receives a substantial negative feedback, to ensure that the voltage Vb is influenced to a minimal extent by fluctuations originating from the circuit.

If it is now taken into account that the current through the source-drain path of the transistor M4 is small and a small current is supplied by the base supply voltage source, the current supplied by the transistor Q3 will be affected only slightly. This gives rise to a very small effect on the emitter-base voltage of the transistor Q3, which varies logarithmically, and to a very small variation of the source-gate voltage of the transistor M4. In fact, this transistor is then operated under conditions of conduction below the threshold in a region where it has a very high transconductance. Such an arrangement of the transistors M4, Q3 and the voltage source 12 thus simulates the state of a transistor of a switching stage when this transistor operates at the switching threshold of this stage. It is evident that input signals having high and low levels at opposite sides of the level of the voltage impressed on the gate of the transistor M4 will produce an unbalance of the differential pair in the switching stage, thereby causing the stage to be switched over.

Figure 4:
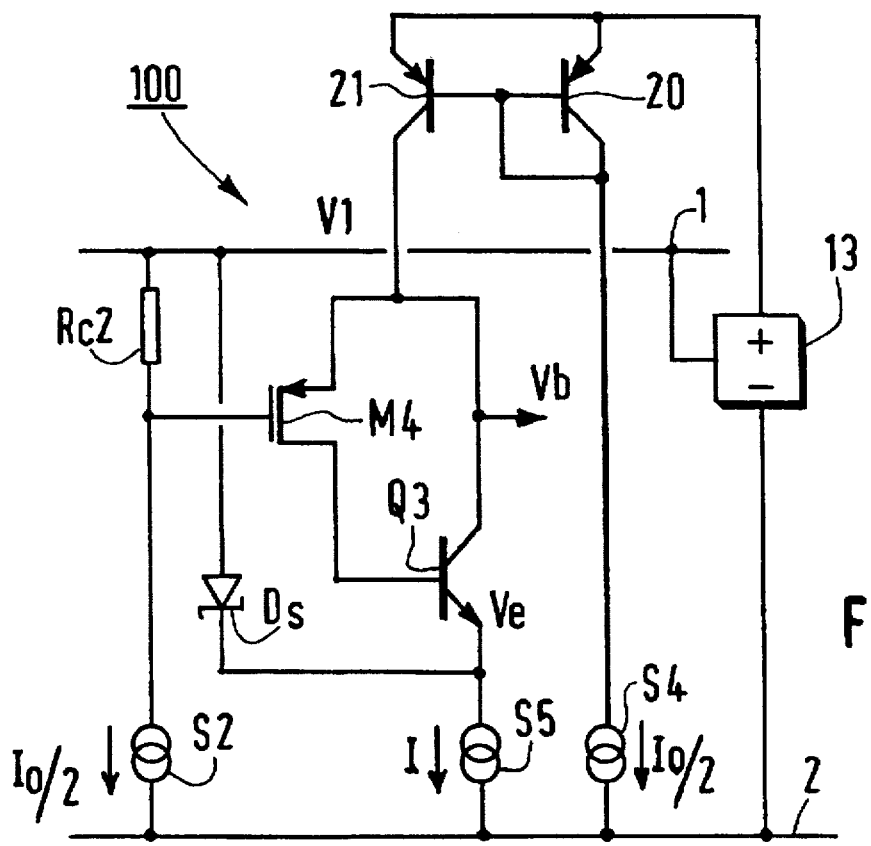

FIG. 4 shows the circuit diagram of a variant of the base supply voltage source. Such a source 100 comprises a voltage doubler circuit 13, which derives a voltage Vs from the voltage V1 at the first supply terminal in a manner similar to the circuit shown in FIG. 3.

In the same way as in the circuit shown in FIG. 3, the base voltage source comprises a field-effect transistor M4 having its drain connected to the base of an NPN transistor Q3. A current source S4 feeds a current having a value Io/2 into an input branch of a current mirror comprising PNP transistors 20, 21. The emitters of the transistors 20 and 21 are connected to the output of the voltage doubler circuit 13 and are thus brought at the voltage Vs. The transistor 21, which forms the output branch of the current mirror, has its collector connected to the source of the transistor M4 and to the collector of the transistor Q3. Such an arrangement forms a current source which supplies a current Io/2 and which is equivalent to the current source S3 shown in FIG. 3.

The gate of the field-effect transistor M4 is biassed in the same way as in the arrangement shown in FIG. 3, i.e. by a voltage drop across a load resistor Rc2 having one end connected to the voltage V1 at the first supply terminal and the other end to a current source S2 which supplies a current Io/2.

In contradistinction to the arrangement in FIG. 3, the emitter voltage Ve at which the emitter of the transistor Q3 is fixed is related to the supply voltage V1 by a constant voltage shift obtained by means of a Schottky diode Ds. The anode of this diode is connected to the voltage V1 at the supply terminal 1. Its cathode is connected to the emitter of the transistor Q3 in a node coupled to a current source S5 which feeds a current I to the second supply terminal 2. The value of the current I is arbitrary, provided that it is greater than Io/2, and can be chosen so as to obtain the desired voltage drop across the diode Ds. As a matter of fact, the current through the diode Ds is equal to I–Io/2 if the output voltage Vb is not loaded.

In the present embodiment the voltage Ve, at which the emitter of the transistor Q3 (as well as the emitters of the transistors in the switching stage) has been brought, follows deviations of the supply voltage V1, which ensures that the bipolar transistors have an emitter-collector voltage determined by the voltage drop across the diode Ds. By an appropriate choice of the area of the junction of the diode Ds and the current through this diode a certain variation is possible of the value of the minimum emitter-collector voltage for all the bipolar transistors, taking into account the voltage swing selected for the output signal, for example 200 mV.

When the values found in practice for the emitter-base and collector-emitter voltages of the NPN transistors of the circuit in accordance with the invention are considered, it appears that the minimum emitter-collector voltage for which saturation is avoided is approximately equal to half the emitter-base voltage of the same transistor. Moreover, since the base bias voltages are obtained by means of a voltage multiplier circuit, it will be appreciated that the supply voltage V1–V2 of the circuit in accordance with the invention can be substantially lower than the voltage used in the prior art.

In a practical example, the circuits of FIGS. 1 and 2 can be powered with a supply voltage VI–V2 of the order of 0.9 V, the voltage doubler circuit supplying a voltage Vs of the order of 1.6 V and the base supply voltage source supplying a voltage Vb of approximately 1.1 V.

In the embodiment described with reference to FIG. 4 the base supply voltage Vb is such that emitters of the bipolar transistors are at a voltage Ve related to the supply voltage V1 and having a minimum deviation from the latter in order to ensure the correct operation of the circuit. Thus, when the supply voltage V1 is comparatively emitter voltage Ve is also comparatively high in such a manner that it is also possible to operate another switching stage in the voltage interval represented by Ve–V2.

Figure 5:
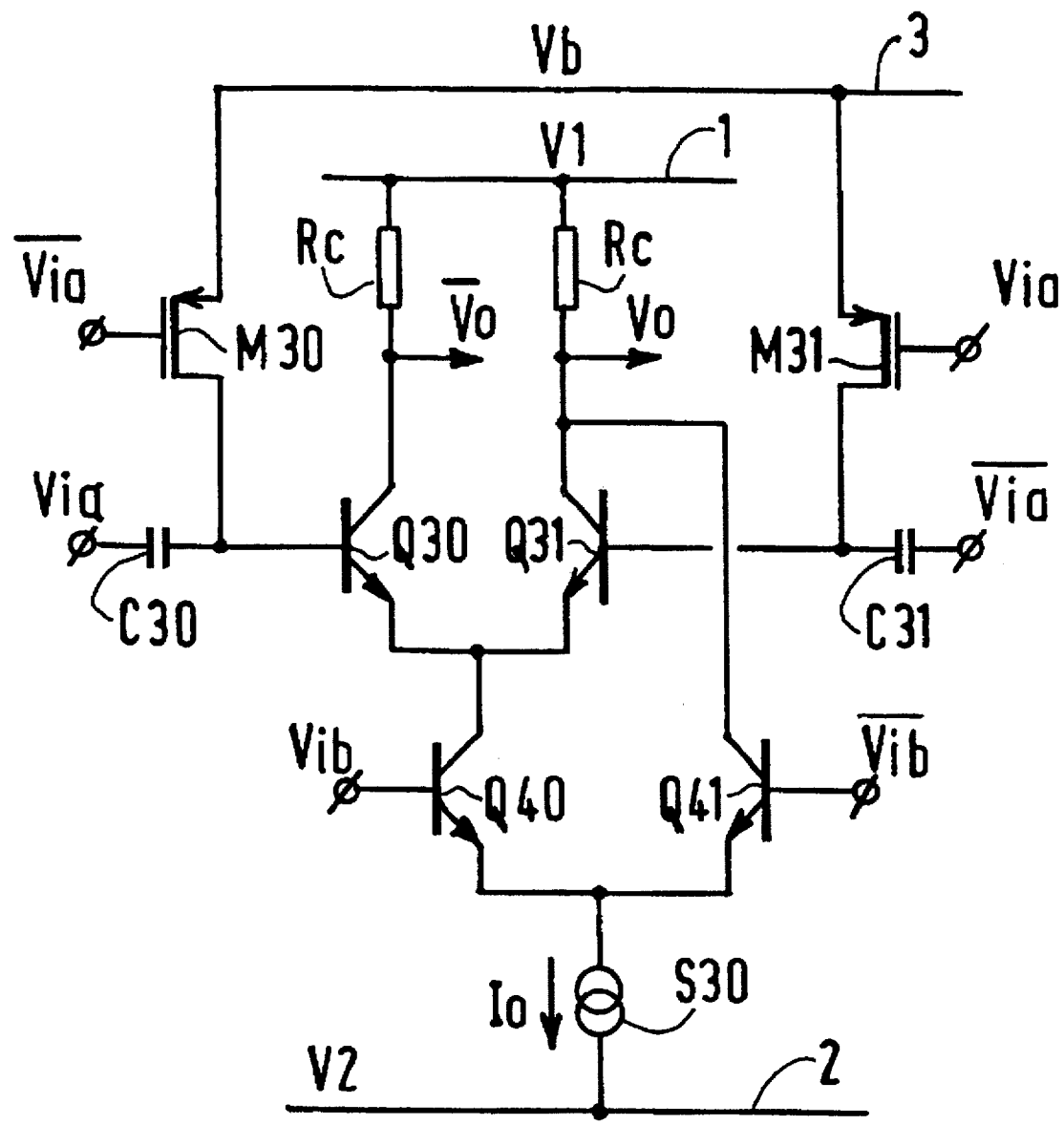

FIG. 5 shows such an embodiment of the invention. A differential pair of transistors Q30, Q31 forms a switching stage comparable to that in FIG. 1, in which the collectors of the transistors are coupled to the first supply terminal 1 via collector load resistors Rc. The transistors Q30 and Q31 further receive a first input signal at their bases. More precisely, a signal Via is applied to the base of the transistor Q30 via a coupling capacitance C30 and a signal $\overline{Via}$ is applied to the base of the transistor Q31 via a coupling capacitance C31.

Moreover, the base of the transistor Q30 is biassed with a base supply voltage Vb supplied by the line 3 via a MOS field-effect transistor M30 whose gate receives the logic inverse of the input signal Via. The base of the transistor Q31 is biassed in a symmetrical manner with the base supply voltage Vb via a MOS field-effect transistor M31 whose gate receives the input signal Via.

With a supply voltage V1 equal to or higher than approximately 1.2 V another switching stage can be arranged between the transistor pair Q30, Q31 and the second supply terminal 2. Thus, the command emitters of the transistors Q30 and Q31 are driven from a current source S30 which feeds the nominal current Io to the second supply terminal 2 via the collector-emitter path of a transistor Q40. This transistor plus another transistor Q41 form another differential pair of transistors which are controlled by a second input signal Vib and its logic inverse $\overline{Vib}$. When the voltages used in practice in this circuit are considered, it is found that the bases of the transistors Q40 and Q41 can be driven without the use of a special power supply, the differential pair Q40 and Q41 being operated in a voltage interval which is sufficiently low with respect to the voltage interval VI–V2. Thus, the bases of these transistors can be driven by direct coupling to the outputs of another switching stage without the use of a coupling capacitance. As a matter of fact, it appears that in practice the voltage levels such as Vo and $\overline{Vo}$ are compatible with the base voltages of the transistors Q40 and Q41.

The advantage of this embodiment of the invention resides in the fact that two switching stages can be operated in series with a supply voltage V1–V2 suitable for only one stage in the prior-art circuits.

The circuit shown in FIG. 5, which corresponds to an AND or a NAND gate depending on the subsequent use of the output signals Vo and $\overline{Vo}$, can thus be operated by means of a supply voltage supplied by a single battery element.

What is claimed is:

1. A logic circuit with bipolar transistors, of the emitter-coupled current-switching type, which circuit comprises at least one differential pair of transistors of given conductivity type forming a switching stage, whose collector-emitter paths are operated respectively between a first and a second supply terminal, which pair is formed by a first and a second transistor whose emitters are connected to one another and are coupled to the second supply terminal via a current source and in which at least one base receives an input signal via a coupling capacitance and is also coupled to a base supply voltage source via an element having a high resistance, characterized in that, coming from a voltage supplied by an output of a supply voltage step-up circuit, the base supply voltage source supplies a controlled voltage which, relative to the second supply terminal, is higher than the voltage at the first supply terminal, and in that said high-resistance element is an insulated-gate field-effect transistor whose channel is of a conductivity type inverse to said given conductivity type and whose gate receives the logic inverse of the input signal.

2. A logic circuit as claimed in claim 1, characterized in that the base supply voltage source comprises:

another bipolar transistor referred to as third transistor, another field-effect transistor referred to as fourth transistor, which third and which fourth transistor are of constructions similar to those of the transistors of a switching stage, the drain of the fourth transistor being connected to the base of the third transistor, and another current source disposed between the output of the voltage step-up circuit and the source of the fourth transistor, to which current source the collector of the third transistor is connected in a node forming an output of said base supply voltage source, the gate of the fourth transistor being supplied with a voltage within the variation interval of the input signal and a direct voltage being impressed on the emitter of the third transistor.

3. A logic circuit as claimed in claim 2, characterized in that the voltage applied to the gate of the fourth transistor is substantially equal to the median value of the input signal, and the value of the current supplied by the other current source is equal to half the current fed to the coupled emitters of the switching stage.

4. A logic circuit as claimed in claim 2, characterized in that in the base supply voltage source the direct voltage impressed on the emitter of the third transistor is supplied by voltage-shifting means which are also connected to the first supply terminal.

5. A logic circuit as claimed in claim 2, characterized in that in the switching stage the coupled emitters of the differential pair of transistors are supplied by the current source via the collector-emitter path of one transistor of another differential pair of transistors whose bases are driven by direct coupling of an output signal of another stage.

* * * * *